United States Patent
Kang

(10) Patent No.: US 10,211,837 B2
(45) Date of Patent: Feb. 19, 2019

(54) FREQUENCY DIVIDER AND CONTROL METHOD THEREOF

(71) Applicant: Airoha Technology Corp., Hsinchu (TW)

(72) Inventor: Yu-Hsuan Kang, Hsinchu (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 104 days.

(21) Appl. No.: 15/405,494

(22) Filed: Jan. 13, 2017

(65) Prior Publication Data

US 2017/0207788 A1 Jul. 20, 2017

(30) Foreign Application Priority Data

Jan. 15, 2016 (TW) .............................. 105101241 A

(51) Int. Cl.
*H03K 21/10* (2006.01)
*H03K 3/037* (2006.01)

(52) U.S. Cl.
CPC ............. *H03K 21/10* (2013.01); *H03K 3/037* (2013.01)

(58) Field of Classification Search
CPC .... H03K 21/10; H03K 21/023; H03K 21/026; H03K 21/08; H03K 21/02; H03K 23/004; H03K 23/005
USPC .......................................................... 327/118
See application file for complete search history.

(56) References Cited

U.S. PATENT DOCUMENTS

| 5,045,854 A | 9/1991 | Windmiller |
| 5,045,856 A | 9/1991 | Windmiller |
| 5,097,491 A * | 3/1992 | Hall ...................... H03K 23/005 377/106 |
| 6,570,946 B1 | 5/2003 | Homol et al. |
| 2007/0085588 A1 * | 4/2007 | Tseng ...................... H03K 3/356 327/308 |
| 2010/0225361 A1 | 9/2010 | Rhee et al. |
| 2012/0019288 A1 | 1/2012 | Badillo |

FOREIGN PATENT DOCUMENTS

| CN | 101814916 B | 2/2012 |
| WO | 2015135490 A1 | 9/2015 |

OTHER PUBLICATIONS

TIPO Office Action dated Sep. 27, 2017 in Taiwan application (No. 105101241).
TIPO Office Action dated Dec. 13, 2016 in corresponding Taiwan application (No. 105101241).

* cited by examiner

*Primary Examiner* — Patrick C Chen
(74) *Attorney, Agent, or Firm* — McClure, Qualey & Rodack, LLP

(57) ABSTRACT

A frequency divider and a control method thereof are provided. The frequency divider includes a phase selector and a control circuit. The phase selector receives N input signals, and selects a first input signal from the N input signals as an output signal according to N selection signals. The frequency of the N input signals are the same, and the phase of the N input signals are different, and every adjacent two of the N input signals have a phase difference of 360°/N, wherein N is a positive integer larger than 2. The control circuit updates the N selection signals according to the output signal, such that the phase selector switches the output signal from the first input signal to a second input signal of the N input signals, wherein the phase of the second input signal leads the phase of the first input signal by 360°/N.

10 Claims, 5 Drawing Sheets

FREQUENCY DIVIDER AND CONTROL METHOD THEREOF

This application claims the benefit of Taiwan application Serial No. 105101241, filed Jan. 15, 2016, the subject matter of which is incorporated herein by reference.

BACKGROUND OF THE INVENTION

Field of the Invention

The invention relates in general to a frequency divider and a control method thereof.

Description of the Related Art

The frequency divider of the prior art includes a phase selector which switches the output signal from an input signal to another input signal. However, the switching process can only be performed when the input signals are at low level or high level both before and after the switching process. Otherwise, glitches will occur to the output signal of the frequency divider and cause error to the frequency generated by the frequency divider. Thus, the frequency divider of the prior art can perform the switching process only during the period when the input signals have the same level both before and after the switching process (the phase difference between two input signals is defined as a period). According to one method provided for resolving the above problems, the input signal with triangular wave is used, such that the input signal gradually switches to high level from low level, and the glitches generated when the input signals have different levels will have a smaller amplitude. According to another method, the phase of the next input signal of the target input signal is detected, such that the switching process is performed only when the phase of the target input signal and the phase of the current input signal have the same level. However, the above two methods cannot completely avoid the occurrence of glitches. During the operation of the switching process, the frequency divider is still subject to the condition that the two input signals must have the same level. Therefore, it has become a prominent task for the industries to provide a method to avoid the occurrence of glitch.

SUMMARY OF THE INVENTION

According to an embodiment of the present disclosure, a frequency divider is provided. The frequency divider includes a phase selector and a control circuit. The phase selector receives N input signals, and selects a first input signal from the N input signals as an output signal according to N selection signals. The frequency of the N input signals are the same, and the phase of the N input signals are different, and every adjacent two of the N input signals have a phase difference of 360°/N, wherein N is a positive integer larger than 2. The control circuit updates the N selection signals according to the output signal, such that the phase selector switches the output signal from the first input signal to a second input signal of the N input signals, wherein the phase of the second input signal leads the phase of the first input signal by 360°/N.

According to another embodiment of the present disclosure, a control method of frequency divider is provided. The control method includes following steps. A first input signal is selected from N input signals as an output signal according to N selection signals, wherein the frequency of the N input signals are the same, and the phase of the N input signals are different, every adjacent two of the N input signals have a phase difference of 360°/N, and N is a positive integer larger than 2. The N selection signals are updated according to the output signal, which is switched from the first input signal to a second input signal of the N input signals, wherein the phase of the second input signal leads the phase of the first input signal by 360°/N.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
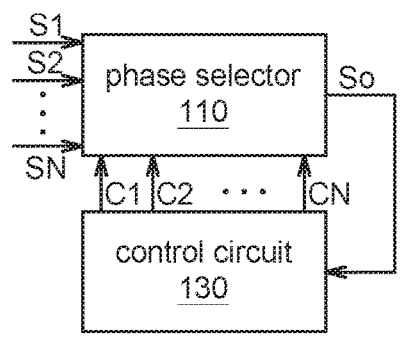
FIG. 1 is a block diagram of a frequency divider according to an embodiment of the present disclosure.

FIG. 1 is a block diagram of a frequency divider 100 according to an embodiment of the present disclosure. The frequency divider 100 includes a phase selector 110 and a control circuit 130. The phase selector 110 receives N input signals S1-SN, and selects a first input signal from N input signals as an output signal So according to N selection signals C1-CN, wherein the N input signals have different phases, every adjacent two of the N input signals have a phase difference of 360°/N, and N is a positive integer larger than 2. The control circuit 130 updates the N selection signals C1-CN according to an output signal So, such that the phase selector 110 switches the output signal from the first input signal to a second input signal of the N input signals, wherein the phase of the second input signal leads the phase of the first input signal by 360°/N.

Figure 2:
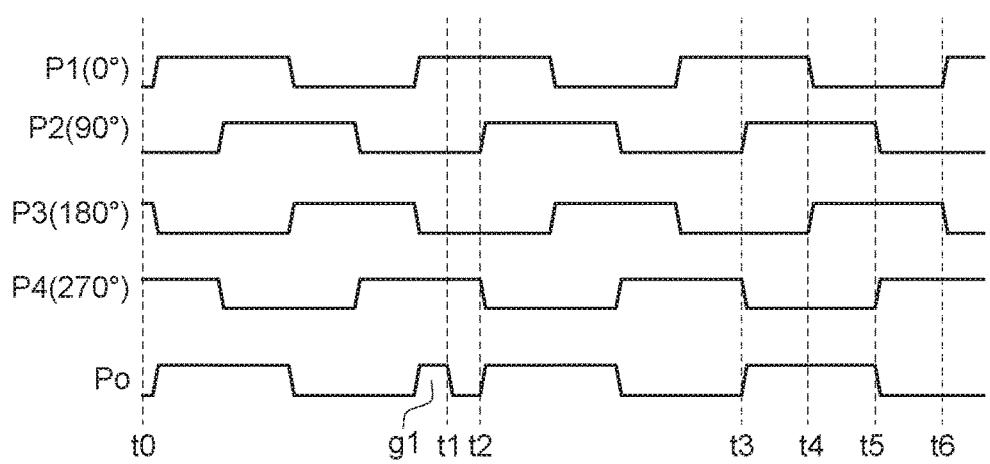
FIG. 2 is a timing diagram of a glitch generated when a conventional frequency divider switches between four input signals.

The frequency divider of the present disclosure is exemplified by a 4-phase frequency divider below. However, the present disclosure is not limited thereto, and can also be used in a multi-phase frequency divider. FIG. 2 is a timing diagram of a glitch generated when a conventional frequency divider switches between four input signals. As indicated in FIG. 2, every adjacent two of the four input signals P1 (0°), P2 (90°), P3 (180°), P4 (270°) have a phase difference of 90°. At time point t0, the phase selector selects the input signal P1 (0°) as an output signal Po. At time point t1, the phase selector switches the output signal Po from the input signal P1 (0°) to the input signal P2 (90°). Therefore, at time point t1 the level of the output signal Po correspondingly changes from high level to low level when the phase selector switches the output signal Po from the input signal P1 (0°) to the input signal P2 (90°). At time point t2, the level of the output signal Po corresponds to that of the input signal P2 (90°) and changes to high level. Under such circumstances, the output signal Po generates a glitch designated by g1 as indicated in FIG. 2A. To avoid the occurrence of glitch, the frequency divider of the prior art must perform the switching process when the two input signals P1 (0°) and P2 (90°) are both at high level, that is, during the switching period SW1 between time point t3 and time point t4. Or, the frequency divider of the prior art must perform the switching process when the two input signals P1 (0°) and P2 (90°) both are at low level, that is, during the switching period SW2 between time point t5 and time point t6. Under such circumstances, the frequency divider of the prior art can perform the switching process only during the switching period SW1 and the switching period W2. That is, the frequency divider of the prior art can perform the switching process during the one period (the phase difference between two input signals is defined as 1 period) when the input signal P1 (0°) is at high level or at low level.

Figure 3A:
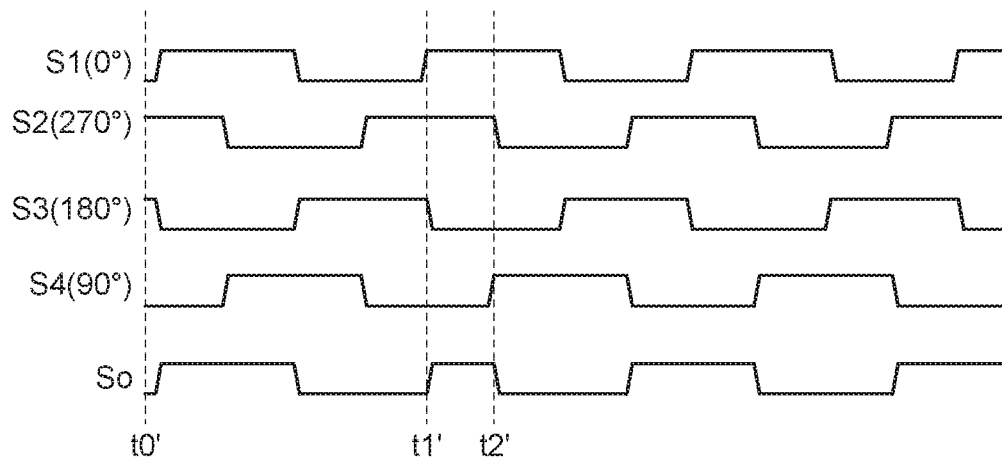
FIG. 3A is a timing diagram of the phase selector of FIG. 1 performing a switching process during a first period according to an embodiment of the present disclosure.

In comparison to the frequency divider of the prior art, the frequency divider 100 of the present disclosure can perform the switching process at any time and also avoid the occurrence of glitch. Referring to FIG. 3A, a timing diagram of the phase selector 110 of FIG. 1 performing a switching process during a first period according to an embodiment of the present disclosure is shown. As indicated in FIG. 3A, every adjacent two of the four input signals S1 (0°), S2 (270°), S3 (180°), S4 (90°) have a phase difference of 90°. In comparison to the prior art, during the switching process, the phase selector 110 of the present disclosure switches the output signal to the input signal S2 (270°) from the input signal S1 (0°), wherein the phase of the input signal S2 (270°) leads the phase of the input signal S1 (0°) by a phase difference of 90°. To put it in greater details, at time point t0', the phase selector 110 selects the input signal S1 (0°) as the output signal So. At time point t1', the phase selector 110 switches the output signal So to the input signal S2 (270°) from the input signal S1 (0°). Therefore, at time point t1', the level of the output signal So remains at high level when the output signal So is switched to the input signal S2 (270°) from the input signal S1 (0°). Then, at time point t2', the level of the output signal So corresponds to that of the input signal S2 (270°) and changes to low level. Therefore, no glitches are generated when the phase selector 110 performs the switching process in the first period when the two input signals S1 (0°) and S2 (270°) both are at high level.

Figure 3B:
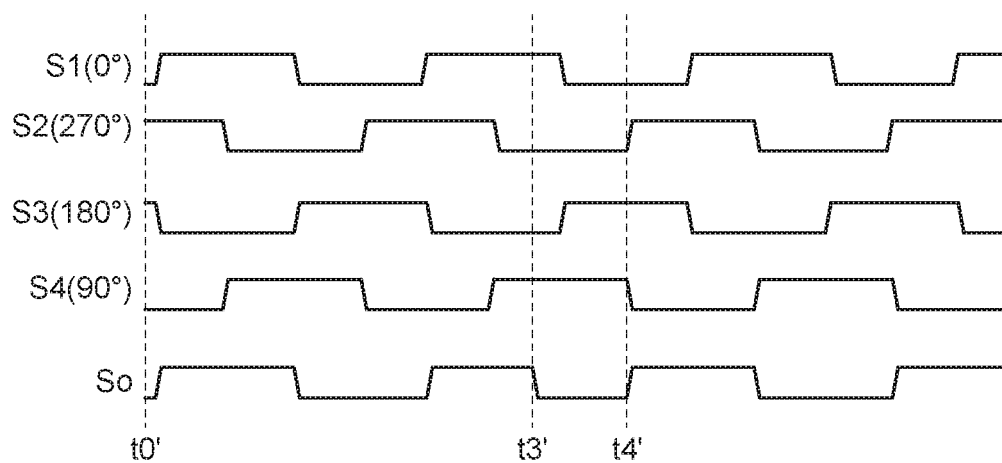
FIG. 3B is a timing diagram of the phase selector of FIG. 1 performing a switching process during a second period according to an embodiment of the present disclosure.

Referring to FIG. 3B, a timing diagram of the phase selector 110 of FIG. 1 performing a switching process during a second period according to an embodiment of the present disclosure is shown. FIG. 3B is different from FIG. 3A in that: the phase selector 110 of FIG. 3B performs the switching process in the second period when the input signal S1 (0°) is at high level but the input signal S2 (270°) is at low level. To put it in greater details, at time point t3', the phase selector 110 switches the output signal So to the input signal S2 (270°) from the input signal S1 (0°). Therefore, at time point t3', the level of the output signal So changes to low level from high level when the output signal is switched to the input signal S2 (270°) from the input signal S1 (0°). Then, at time point t4', the level of the output signal So corresponds to that of the input signal S2 (270°) and changes to high level. Under such circumstances, no glitches are generated although the two input signals S1 (0°) and S2 (270°) have different levels.

Figure 3C:
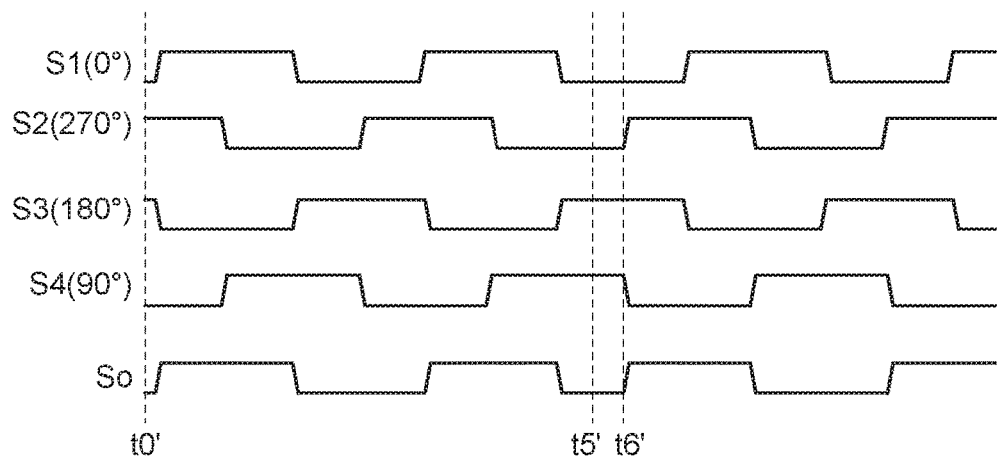
FIG. 3C is a timing diagram of the phase selector of FIG. 1 performing a switching process during a third period according to an embodiment of the present disclosure.

Referring to FIG. 3C, a timing diagram of the phase selector 110 of FIG. 1 performing a switching process during a third period according to an embodiment of the present disclosure is shown. As indicated in FIG. 3C, the phase selector 110 performs the switching process in the third period when the input signal S1 (0°) and the input signal S2 (270°) both are at low level. At time point t5', the phase selector 110 switches the output signal So to the input signal S2 (270°) from the input signal S1 (0°). Therefore, the level of the output signal So remains at low level when the output signal So is switched to the input signal S2 (270°) form the input signal S1 (0°). Then, at time point t6', the level of the output signal So corresponds to that of the input signal S2 (270°) and changes to high level. Therefore, no glitches are generated when the phase selector 110 performs the switching process in the third period when the two input signals S1 (0°) and S2 (270°) both are at high level.

Figure 3D:
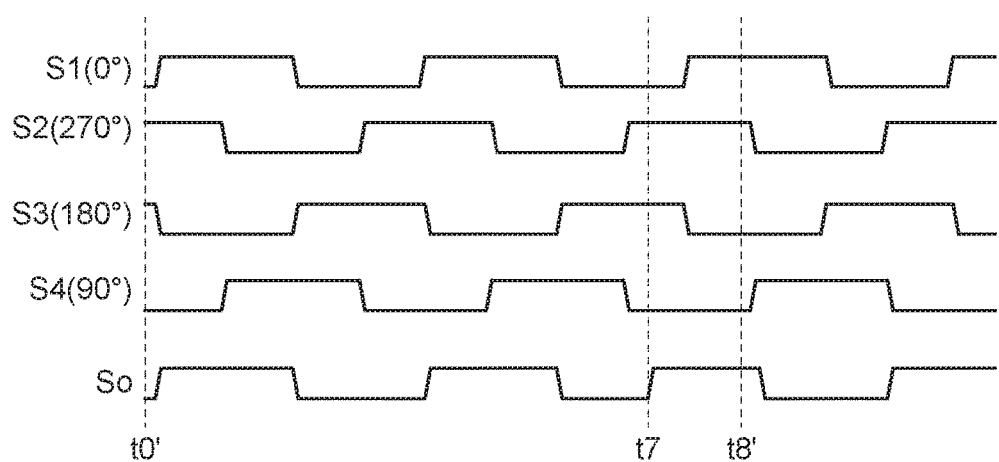
FIG. 3D is a timing diagram of the phase selector of FIG. 1 performing a switching process during a fourth period according to an embodiment of the present disclosure.

Referring to FIG. 3D, a timing diagram of the phase selector 110 of FIG. 1 performing a switching process during a fourth period according to an embodiment of the present disclosure is shown. As indicated in FIG. 3D, the phase selector 110 performs the switching process in the fourth period when the input signal S1 (0°) is at low level but the input signal S2 (270°) is at high level. To put it in greater details, at time point t7', the phase selector 110 switches the output signal So to the input signal S2 (270°) from the input signal S1 (0°). Therefore, the level of the output signal So changes to high level from low level when the output signal is switched to the input signal S2 (270°) from the input signal S1 (0°). Then, at time point t8', the level of the output signal So corresponds to that of the input signal S2 (270°) and changes to low level. Under such circumstances, no glitches are generated although the two input signals S1 (0°) and S2 (270°) have different levels.

As disclosed above, the phase selector 110 of the present disclosure can switch the output signal to the input signal S2 (270°) from the input signal S1 (0°) from the first period to the fourth period without generating any glitches. That is, the phase selector 110 of the present disclosure can perform the switching process at any time without generating any glitches and is not subject to the condition that the two input signals S1 (0°) and S2 (270°) must be at the same level.

However, the present disclosure is not limited thereto. After the output signal is switched to the input signal S2 (270°) from the input signal S1 (0°), the phase selector 110 can also switch the output signal to the input signal S3 (180°) from the input signal S2 (270°) without generating any glitches. Moreover, the present disclosure is not only applicable to a 4-phase frequency divider, and is also applicable to a multi-phase frequency divider. That is, the phase selector 110 of the present disclosure can switch the output signal from an input signal to another input signal whose phase leads the phase of the original input signal without generating any glitches.

Figure 4:
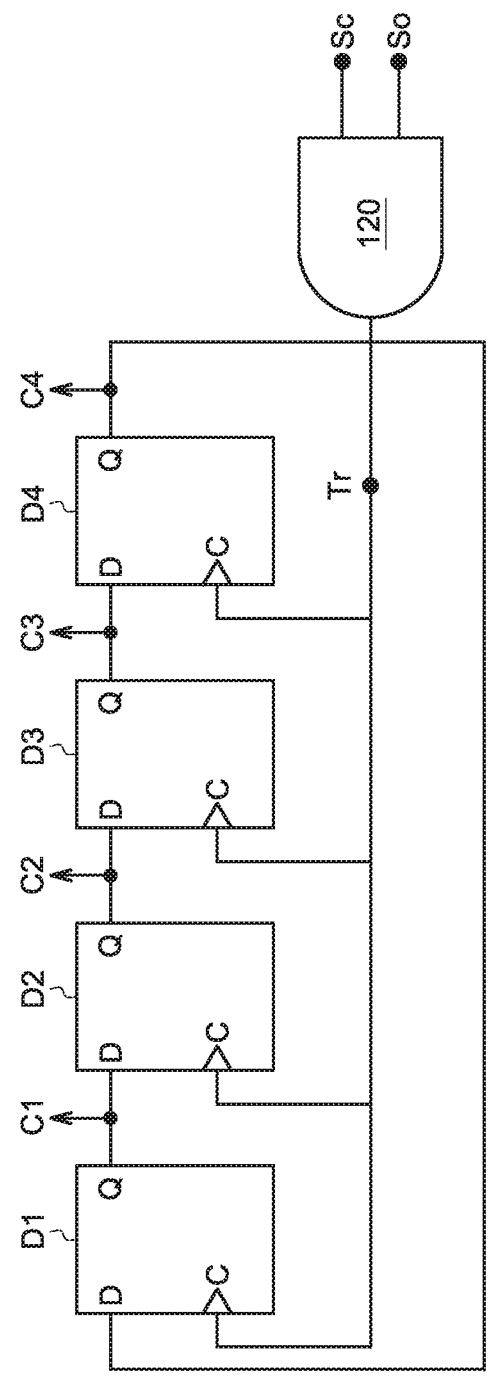
FIG. 4 is a circuit diagram of a control circuit according to an embodiment of the present disclosure.

FIG. 4 is a circuit diagram of a control circuit 130 according to an embodiment of the present disclosure. As indicated in FIG. 4, the control circuit 130 includes four D-type flip-flops and an AND gate 120. The AND gate 120 generates a trigger signal Tr according to an output signal So and a control signal Sc, and updates the N selection signals C1-C4 when the trigger signal Tr is enabled. In the present embodiment, it is exemplified that the 4-phase frequency divider is controlled using four D-type flip-flops. However, the present disclosure is not limited thereto. For example, the control circuit 130 may include N D-type flip-flops for controlling the N-phase frequency divider. The four D-type flip-flops D1-D4 are connected in series from the first D-type flip-flop D1 to the fourth D-type flip-flops D4. To put it in greater details, each D-type flip-flop has an input end D, an output end Q and a clock input end C. The output end Q of the first D-type flip-flop D1 is coupled to the input end D of the second D-type flip-flop D2. The output end Q of the second D-type flip-flop D2 is coupled to the input end D of the third D-type flip-flop D3. By the same analogy, the output end of the last D-type flip-flop (the D-type flip-flop is D4 as exemplified in the present example) is coupled to the input end D of the first D-type flip-flop D1. The four D-type flip-flops D1-D4 all receive the trigger signal Tr. The output ends Q of the four D-type flip-flops D1-D4 provide four selection signals D1-D4 corresponding to 4 input signals S1 (0°), S2 (270°), S3 (180°), S4 (90°) respectively.

In the present example, at a specific time point, only the output end Q of one of the four D-type flip-flops is at high level. That is, only one of the four selection signals D1-D4 is at high level. Meanwhile, the phase selector 110 selects the input signal S1 (0°) corresponding to the high-level selection signal as the output signal So.

To put it in greater details, suppose at the beginning the output end Q of the first D-type flip-flop is at high level, and the output ends Q of the remaining three D-type flip-flops D2-D4 are at low level. That is, the levels of the selection signals D1-D4 respectively are (1, 0, 0, 0). Meanwhile, the phase selector 110 selects the input signal S1 (0°) corresponding to the high-level selection signal as an output signal So. During the switching process, the control signal Sc is enabled and changes to high level, the AND gate 120 receives the high-level control signal Sc and the output signal So, and generates an enabled high-level trigger signal Tr when both the control signal Sc and the output signal So are at high-level. When the trigger signal Tr is enabled and changes to high level, the trigger signal Tr will trigger the four D-type flip-flops. Meanwhile, the D-type flip-flop D1 is triggered and changes to low level because the D-type flip-flop D1 is coupled to the output end Q of the D-type flip-flop D4. The D-type flip-flop D2 is triggered and changes to high level from low level because the D-type flip-flop D2 is coupled to the output end Q of the D-type flip-flop D1. The D-type flip-flop D3 and the D-type flip-flop are also triggered but remain at low level. That is, the outputs of the four D-type flip-flops D1-D4 will be shifted to the right by one. That is, the levels of the selection signals D1-D4 change to (0, 1, 0, 0). Thus, the phase selector 110 selects the input signal S2 (270°) corresponding to the high-level selection signal as the output signal So.

Similarly, during the next switching process, the control signal Sc is enabled and changes to high level to trigger the four D-type flip-flops, and the outputs of the four D-type flip-flops D1-D4 will be shifted to the right by one. That is, the levels of the selection signals D1-D4 change to (0, 0, 1, 0). Thus, the phase selector 110 switches the output signal So to the input signal S3 (180°) from the input signal S2 (270°), and the rest can be obtained by analogy. Therefore, the control circuit 130 of FIG. 4 enables the phase selector 110 to switch the output signal from an input signal to another input signal whose phase leads the phase of the original input signal without generating any glitches. The control circuit 130 of FIG. 4 can be realized by four D-type flip-flops. However, the present disclosure is not limited thereto. Anyone ordinary skilled in the technology will be able to make appropriate variation design to fit actual needs, and any variation design will do as long as four selection signals can be provided to enable the phase selector 110 to switch the output signal from an input signal to another input signal whose phase leads the phase of the original input signal.

Moreover, the frequency divider 100 of the present disclosure is an N/(N−1) frequency divider. When the trigger signal Tr is not enabled and at low level, the frequency divider is in an N division mode, and is therefore divided by N. When the trigger signal Tr is enabled and changes to high level, the output signal is switched forward by one phase, that is, the output signal is reduced by one phase, the frequency divider is in an (N−1) division mode, and is therefore divided by (N−1).

Figure 5:
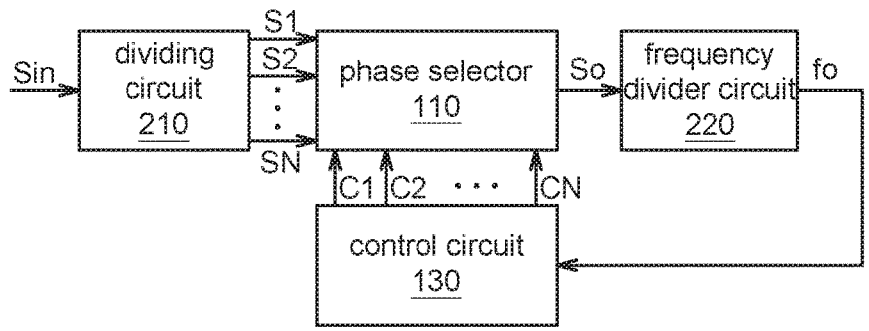
FIG. 5 is a block diagram of a frequency divider according to another embodiment of the present disclosure.

FIG. 5 is a block diagram of a frequency divider 200 according to another embodiment of the present disclosure. The frequency divider 200 of FIG. 5 is different from the frequency divider 100 of FIG. 1 in that: the frequency divider 200 may include a dividing circuit 210. The dividing circuit 210 generates N input signals S1-SN according to a signal Sin. The dividing circuit 210, realized by multiple flip-flops, divides the signal Sin by N to generate N input signals S1-SN having the same frequency. Every adjacent two of the N input signals S1-SN have a phase difference of 360°/N. Suppose the frequency of the input signal Sin is fin. Then, the frequency of the N input signals S1-SN is fin/N of the frequency of the input signal Sin.

The frequency divider 200 further includes a frequency divider circuit 220, which is coupled between the phase selector 110 and the AND gate 120. The frequency divider circuit 220 generates a division signal fo according to the output signal So. The frequency divider circuit 220 can be realized by a frequency divider, which is divided by k, wherein k is a positive integer larger than 1. When the control signal Sc is at low level, the frequency of the division signal to of the frequency divider 200 is: fin/(N×k). When the control signal Sc is at low level, the frequency of the division signal to of the frequency divider 200 is: fin/[(N−1)×k]. Therefore, the frequency divider 200 can form multiple frequencies according to the two modes.

Figure 6:
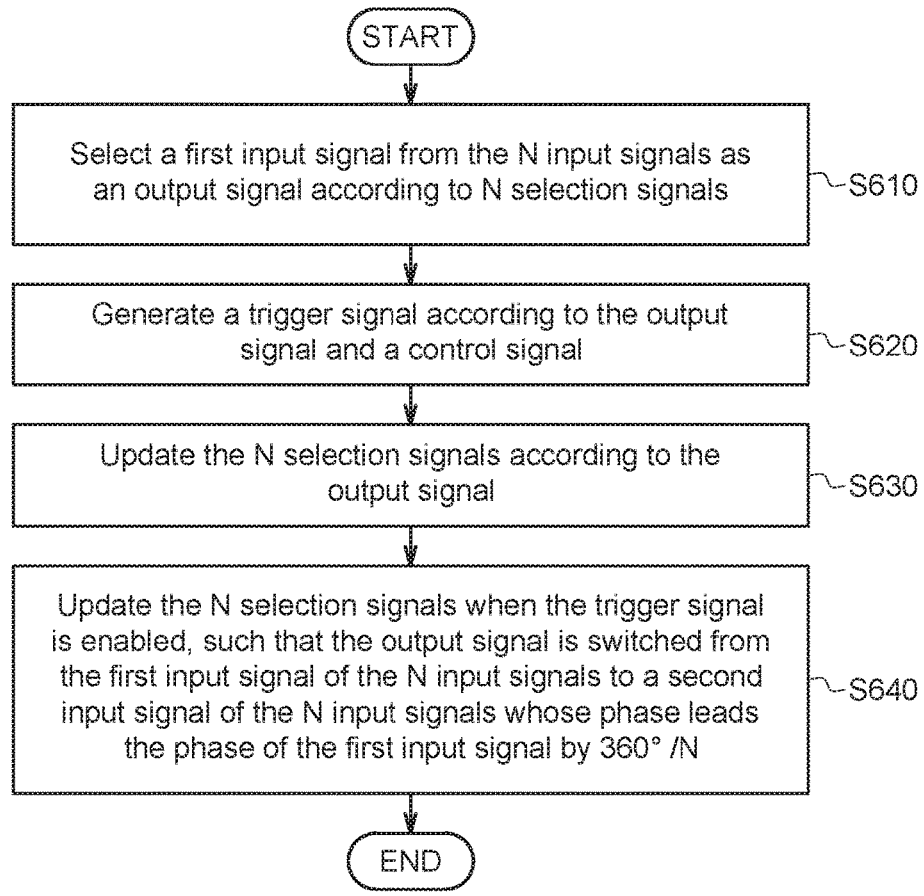
FIG. 6 is a flowchart of a control method of frequency divider according to an embodiment of the present disclosure.

A control method of frequency divider is provided in above embodiments of the present disclosure. FIG. 6 is a flowchart of a control method of frequency divider according to an embodiment of the present disclosure. The frequency divider can be realized by such as the frequency divider 100 of FIG. 1 or the frequency divider 200 of FIG. 5. The control method includes following steps. Firstly, the method begins at step S610, a first input signal is selected from the N input signals as an output signal according to N selection signals, wherein the N input signals have the same frequency but different phases, every adjacent two of the N input signals have a phase difference of 360°/N, and N is a positive integer larger than 2. Then, the method proceeds to step S620, a trigger signal is generated according to the output signal and a control signal. Then, the method proceeds to step S630, the N selection signals is updated according to the output signal. Lastly, the method proceeds to S640, when the trigger signal is enabled, the N selection signals is updated such that the output signal is switched from the first input signal to a second input signal whose phase leads the phase of the first input signal by 360°/N.

According to the frequency dividers and the control method thereof provided in above embodiments, the frequency divider switches the output signal from an input signal to another input signal whose phase leads the phase of the original input signal without generating any glitches. Therefore, during the switching process, the frequency divider of the present disclosure can perform the switching process at any time point and is not subject to the levels of the input signals.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A frequency divider, comprising:
   a phase selector for receiving N input signals, and selecting a first input signal from N input signals as an output signal according to N selection signals, wherein the frequency of the N input signals are the same, and the phase of the N input signals are different, every adjacent two of the N input signals have a phase difference of 360°/N, and N is a positive integer larger than 2; and
   a control circuit for updating the N selection signals according to the output signal, such that the phase selector switches the output signal from the first input signal to a second input signal of the N input signals, wherein the phase of the second input signal leads the phase of the first input signal by 360°/N,
   wherein the control circuit comprises:
   N flip-flops connected in series from a first flip-flop to an N-th flip-flop, wherein each of the N flip-flops has a clock input end, which receives a trigger signal, and output ends of the N flip-flops provide the N selection signals respectively, each of the N flip-flops has an input end and the output end, the output end of an i-th flip-flop is coupled to the input end of an (i+1)-th flip-flop, the output end of the N-th flip-flop is coupled to the input end of the first flip-flop, i is a positive integer and 1≤i≤N−1, the output end of the i-th flip-flop provides the selection signal corresponding to the first input signal, and the output end of the (i+1)-th flip-flop provides the selection signal corresponding to the second input signal; and
   an AND gate for generating the trigger signal according to the output signal and a control signal and further updating the N selection signals when the trigger signal is enabled.

2. The frequency divider according to claim 1, wherein the phase selector selects the first input signal as the output signal when the output end of the i-th flip-flop is at high level, and the phase selector selects the second input signal as the output signal when the output end of the (i+1)-th flip-flop is at high level.

3. The frequency divider according to claim 1, wherein the frequency divider is an N/(N−1) frequency divider; when the trigger signal is enabled, the frequency divider is in an (N−1) division mode; when the trigger signal is not enabled, the frequency divider is in an N division mode.

4. The frequency divider according to claim 1, wherein the frequency divider further comprises:
   a frequency divider circuit coupled between the phase selector and an AND gate for generating a division signal according to the output signal.

5. The frequency divider according to claim 1, wherein the frequency divider further comprises:
   a dividing circuit for generating the N input signals according to a signal.

6. A control method of frequency divider, comprising:
   selecting a first input signal from N input signals as an output signal according to N selection signals, wherein the frequency of the N input signals are the same, and the phase of the N input signals are different, every adjacent two of the N input signals have a phase difference of 360°/N, and N is a positive integer larger than 2;
   providing the N selection signals using N flip-flops respectively;
   generating a trigger signal according to the output signal and a control signal, and updating the N selection signals when the trigger signal is enabled; and
   updating the N selection signals according to the output signal to switch the output signal from the first input signal to a second input signal of the N input signals, wherein the phase of the second input signal leads the phase of the first input signal by 360°/N,
   wherein the N flip-flops are connected in series from a first flip-flop to an N-th flip-flop, each of the N flip-flops has a clock input end, which receives the trigger signal, and output ends of the N flip-flops provide the N selection signals respectively, each of the N flip-flops has an input end and the output end, the output end of an i-th flip-flop is coupled to the input end of an (i+1)-th flip-flop, the output end of the N-th flip-flop is coupled to the input end of the first flip-flop, i is a positive integer and 1≤i≤N−1, the output end of the i-th flip-flop provides the selection signal corresponding to the first input signal, and the output end of the (i+1)-th flip-flop provides the selection signal corresponding to the second input signal.

7. The control method according to claim 6, further comprising:
   selecting the first input signal as the output signal when the output end of the i-th flip-flop is at high level; and
   selecting the second input signal as the output signal when the output end of the (i+1)-th flip-flop is at high level.

8. The control method according to claim 6, wherein the frequency divider is an N/(N−1) frequency divider; when the trigger signal is enabled, the frequency divider is in an (N−1) division mode; when the trigger signal is not enabled, the frequency divider is in an N division mode.

9. The control method according to claim 6, further comprising:
   generating a division signal according to the output signal using a frequency divider circuit.

10. The control method according to claim 6, further comprising:
    generating the N input signals according to a signal using a dividing circuit.

* * * * *